(12) United States Patent
Chou

(10) Patent No.: US 6,407,948 B1
(45) Date of Patent: Jun. 18, 2002

(54) CIRCUIT AND METHOD THEREOF FOR CORRECTING OVER-ERASED FLASH MEMORY CELLS

(75) Inventor: Kuo-Yu Chou, Hsin-Chu Hsien (TW)

(73) Assignee: AMIC Technology (Taiwan) Inc., Hsin-Chu Hsien (TW)

( * ) Notice: Subject to any disclaimer, the term of this patent is extended or adjusted under 35 U.S.C. 154(b) by 0 days.

(21) Appl. No.: 09/683,079

(22) Filed: Nov. 15, 2001

(30) Foreign Application Priority Data

Apr. 13, 2001 (TW) ........................................ 090108896

(51) Int. Cl.$^7$ .............................................. G11C 16/34
(52) U.S. Cl. .............................. 365/185.3; 365/185.33; 365/185.29; 365/185.22; 365/185.09
(58) Field of Search ....................... 365/185.3, 185.33, 365/185.29, 185.21, 185.19, 185.22, 185.24, 185.09

(56) References Cited

U.S. PATENT DOCUMENTS

| | | | | |
|---|---|---|---|---|
| 5,335,198 A | * | 8/1994 | Van Buskirk et al. | ... 365/185.3 |
| 5,359,558 A | * | 10/1994 | Chang et al. | ............ 365/185.3 |
| 5,576,991 A | * | 11/1996 | Radjy et al. | ............ 365/185.24 |
| 5,642,311 A | * | 6/1997 | Cleveland et al. | ....... 365/185.3 |
| 5,828,601 A | * | 10/1998 | Hollmer et al. | .......... 365/185.2 |
| 6,285,588 B1 | * | 9/2001 | Fastow | .................. 365/185.19 |
| 6,285,599 B1 | * | 9/2001 | Shimada et al. | ....... 365/185.29 |

OTHER PUBLICATIONS

Seiji Yamada et al., "A Self–Convergence Erasing Scheme for a Simple Stacked Gate Flash EEPROM", IEEE Technical Digest, IEDM 1991, pp. 307–310.*
Kuniyoshi Yoshikawa et al., "Comparison of Current Flash EEPROM Erasing Methods : Stability and How to Control", IEEE Technical Digest, IEDM 1992, pp. 595–598.*
Danny P. Shum et al., "A Novel Band–to–Band Tunneling Induced Convergence Mechanism for Low Current, High Density Flash EEPROM Applications", IEEE Technical Digest, IEDM 1994, pp. 41–44.*
Seiji Yamada et al., "A Self–Convergence Erase for NOR Flash EEPROM Using Avalanche Hot Carrier Injection", IEEE Transactions on Electron Devices, vol. 43, No. 11, Nov. 1996, pp. 1937–1941.*

* cited by examiner

Primary Examiner—Andrew Q. Tran
(74) Attorney, Agent, or Firm—Winston Hsu

(57) ABSTRACT

A flash memory circuit has a flash memory array and a processor. The flash memory array has a plurality of erasable flash memory cells. Each of the flash memory cells is electrically connected to a corresponding bitline. If any over-erased flash memory cell exists in the flash memory array, a processor controls the flash memory circuit to apply a correction voltage to the bitline connected to the over-erased flash memory cell so as to correct the over-erased flash memory cell. The correction voltage is continuously applied until a current along the corresponding bitline drops below a predetermined value.

10 Claims, 5 Drawing Sheets

CIRCUIT AND METHOD THEREOF FOR CORRECTING OVER-ERASED FLASH MEMORY CELLS

BACKGROUND OF THE INVENTION

1. Field of the Invention

The present invention relates to a circuit and related method for correcting over-erased flash memory cells, and more particularly, to a circuit and method for continuously applying a correction voltage to a bitline coupled to an over-erased flash memory cell to correct the over-erased flash memory cell.

2. Description of the Prior Art

Please refer to FIG. 1. FIG. 1 is a diagram of a prior art flash memory circuit 10. The flash memory circuit 10 is disclosed in U.S. Pat. No. 5,642,311 "Overerase correction for flash memory which limits overerase and prevents erase verify errors." The flash memory circuit 10 comprises a flash memory array 20 and a processor 34 for controlling the operations of the flash memory circuit 10 to perform reading, erasing, or writing to the flash memory array 20. The flash memory array 20 comprises a plurality of flash memory cells 22. Each flash memory cell 22 comprises a source S, a control gate G, and a drain D, wherein the source S is electrically connected to a voltage source Vss, the control gate G is electrically connected to a corresponding wordline 23, the drain D is electrically connected to a bitline 24, and each bitline 24 is electrically connected to a bit line pull-up circuit 26. When the processor 34 performs reading, erasing, or writing to a flash memory cell 22, related control signals are respectively sent to a row decoder 30 and a column decoder 28 to control a voltage of the wordline 23 and the bitline 24 connected to the appropriate flash memory cell 22. The flash memory circuit 10 further comprises a reference memory array 38 for outputting a reference signal, a sense amplifier 36 for comparing the reference signals outputted from the reference memory array 38 with the signals outputted from the flash memory cells 22, a data register 40 for temporarily storing data outputted from the flash memory array 20, and a power source 32 for providing the electrical power needed by the flash memory circuit 10.

Currently, the most well-known and commonly used flash memory erasing method is called Fowler-Nordheim tunneling (FN tunneling). When the processor 34 performs an erasing procedure on a flash memory cell 22, a voltage pulse is continually applied to the flash memory cell 22. The erasing voltage pulse generates an electromotive force (EMF) with a negative potential difference between the control gate G and the drain D of the flash memory cell 22. For example, when an erasing voltage pulse is applied to the flash memory cell 22, the voltage of the control gate G is 10 volts, and the voltage of the drain D is +5.5 volts. With the above erasing procedure, electrons accumulated in a floating gate of the flash memory cell 22 are reduced because the electrons pass through a thin dielectric layer of the flash memory cell 22 to cause a reduction of the threshold voltage of the flash memory cell 22. When the erasing procedure is performed, the processor 34 simultaneously applies an erasing voltage pulse to each flash memory cell 22 of the flash memory array 20 to erase all of the flash memory cells 22. However, not all of the flash memory cells 22 of the flash memory array 20 have the same circuit characteristics. When the processor 34 erases the flash memory array 20, some of the flash memory cells 22 will suffer a phenomenon termed over-erasure, and over-erased flash memory cells 22 are consequently generated. An over-erased flash memory cell 22 is one in which a threshold voltage is less than 0 volts. When the flash memory array 20 has over-erased flash memory cells 22, the data reading accuracy of the flash memory array 20 is adversely affected. For example, when data stored in a flash memory cell 22 of the flash memory array 20 is to be read, if the bitline 24 connected to the flash memory cell 22 is connected to any over-erased flash memory cells 22, the bitline 24 will suffer from leakage current while reading the flash memory cell 22. This leakage current will affect the data reading accuracy. Therefore, to avoid over-erased flash memory cells 22, the processor 34 tests if there are any over-erased flash memory cells 22 after erasing the flash memory array 20. If any over-erased flash memory cells 22 are present, the processor 34 executes a correction procedure to correct the over-erased flash memory cells 22. This correction procedure returns the threshold of the over-erased flash memory cells 22 to a standard value.

Please refer to FIG.2. FIG.2 is a flow chart for erasing the flash memory array 20 and correcting any over-erased flash memory cells 22. When the flash memory circuit 10 erases the flash memory array 20, the flash memory circuit 10 determines if each flash memory cell 22 is erased by incrementally changing a row address and a column address. To ensure that a flash memory cell 22 is erased, an erasing voltage is applied to the flash memory array 20 to erase all of the flash memory cells 22. After all of the flash memory cells 22 are erased, the flash memory circuit 10 tests to see if any over-erased flash memory cells 22 were generated. If over-erased flash memory cells 22 are present, a correction procedure is performed. The above procedure is indicated in the following steps:

Step 50: Start.

Step 52: Set the row address to the first row.

Step 54: Set the column address to the first column.

Step 56: Is the flash memory cell 22 at current row and column address unerased? If yes, go to step 58. If no, go to step 70.

Step 58: Apply an erasing voltage to the flash memory array 20 to erase all flash memory cells 22.

Step 60: Set the column address to the first column.

Step 62: Are any of the flash memory cells 22 at current column address over-erased? If yes, go to step 64. If no, go to step 66.

Step 64: Apply an over-erase correction pulse to the bitline of the column address. Go to step 62.

Step 66: Increment the column address by 1.

Step 68: Is the column address the largest possible column address? If yes, go to step 54. If no, go to step 62.

Step 70: Increment the column address by 1.

Step 72: Is the column address the largest possible column address? If yes, go to step 74. If no, go to step 56.

Step 74: Increment the row address by 1.

Step 76: Is the row address at the largest possible row value? If yes, go to step 80. If no, go to step 54.

Step 80: End.

According to the above procedure, when the flash memory circuit 10 corrects over-erased flash memory cells 22, step 62 and step 64 must be repeatedly performed until the over-erased flash memory cells 22 are corrected, or until step 62 and step 64 are performed a predetermined number of times. After step 62 and step 64 have been performed a predetermined number of times, the flash memory array 20 is considered corrupted. This predetermined number of times can be set manually. Note that, after the flash memory circuit 10 completes step 64, step 62 is performed again to determine if the correction voltage pulse has corrected the over-erased flash memory cell or cells 22. Consequently, when step 62 and step 64 are performed too many times, the total checking time can become quite long. Furthermore, some over-erased flash memory cells 22 may need several more applications of the correction voltage in excess of the predetermined number of times in order to be properly corrected. The flash memory array 20 may thus be prematurely considered corrupted.

SUMMARY OF INVENTION

It is therefore a primary objective of the present invention to provide a circuit and associated method for correcting over-erased flash memory cells to solve the above-mentioned problems.

According to the claimed invention, a flash memory circuit has a flash memory array and a processor. The flash memory array has a plurality of erased flash memory cells. Each of the flash memory cells is respectively electrically connected to a corresponding bitline. If any over-erased flash memory cell exists in the flash memory array, the processor controls the flash memory circuit to apply a correction voltage to the bitline connected to the over-erased flash memory cell so as to correct the over-erased flash memory cell. After the correction voltage is applied to the bitline connected to the over-erased flash memory cell, if the current of the bitline is reduced to a predetermined value, the flash memory circuit stops applying the correction voltage to the bitline of the over-erased flash memory cell.

It is an advantage of the present invention that the flash memory circuit 10 avoids wasting too much time to correct any over-erased flash memory cells, and prevents an available flash memory array 20 from being prematurely discarded.

These and other objectives and advantages of the present invention will no doubt become obvious to those of ordinary skill in the art after having read the following detailed description of the preferred embodiment that is illustrated in the various figures and drawings.

DETAILED DESCRIPTION

Figure 1:
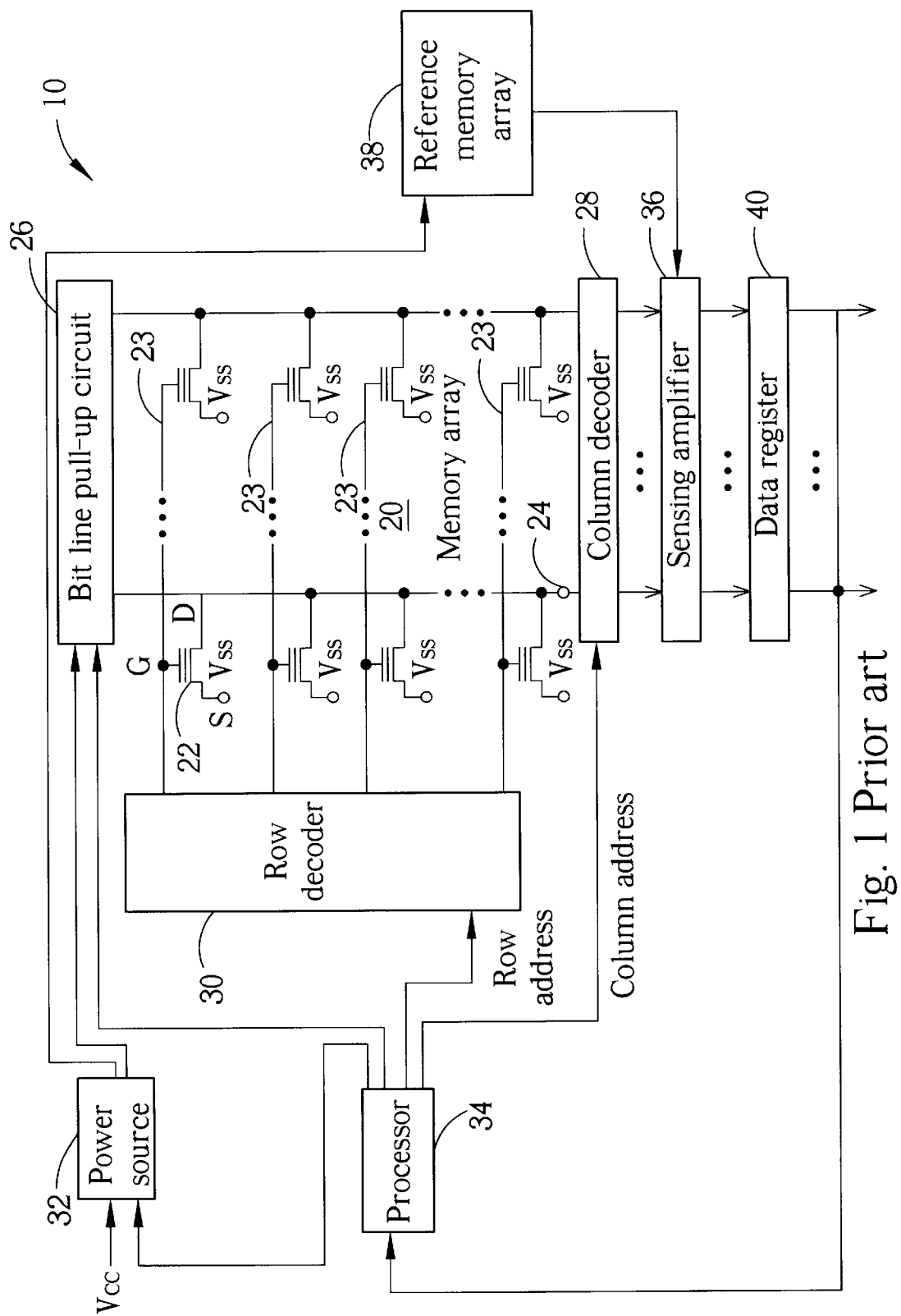
FIG. 1 is a diagram of a prior art flash memory circuit.
Figure 2:
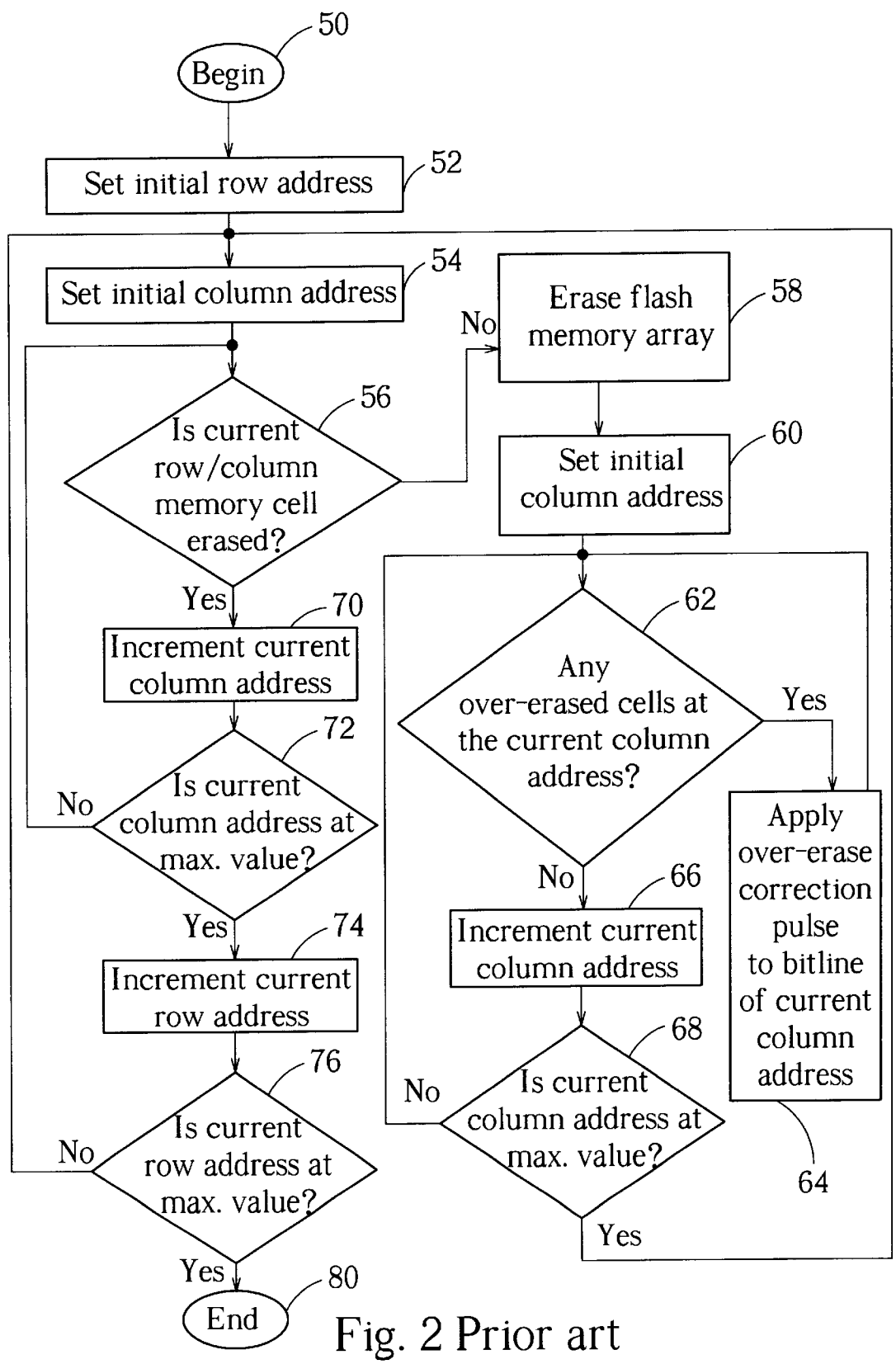
FIG. 2 is a flow chart for erasing a flash memory array and correcting over-erased flash memory cells.
Figure 3:
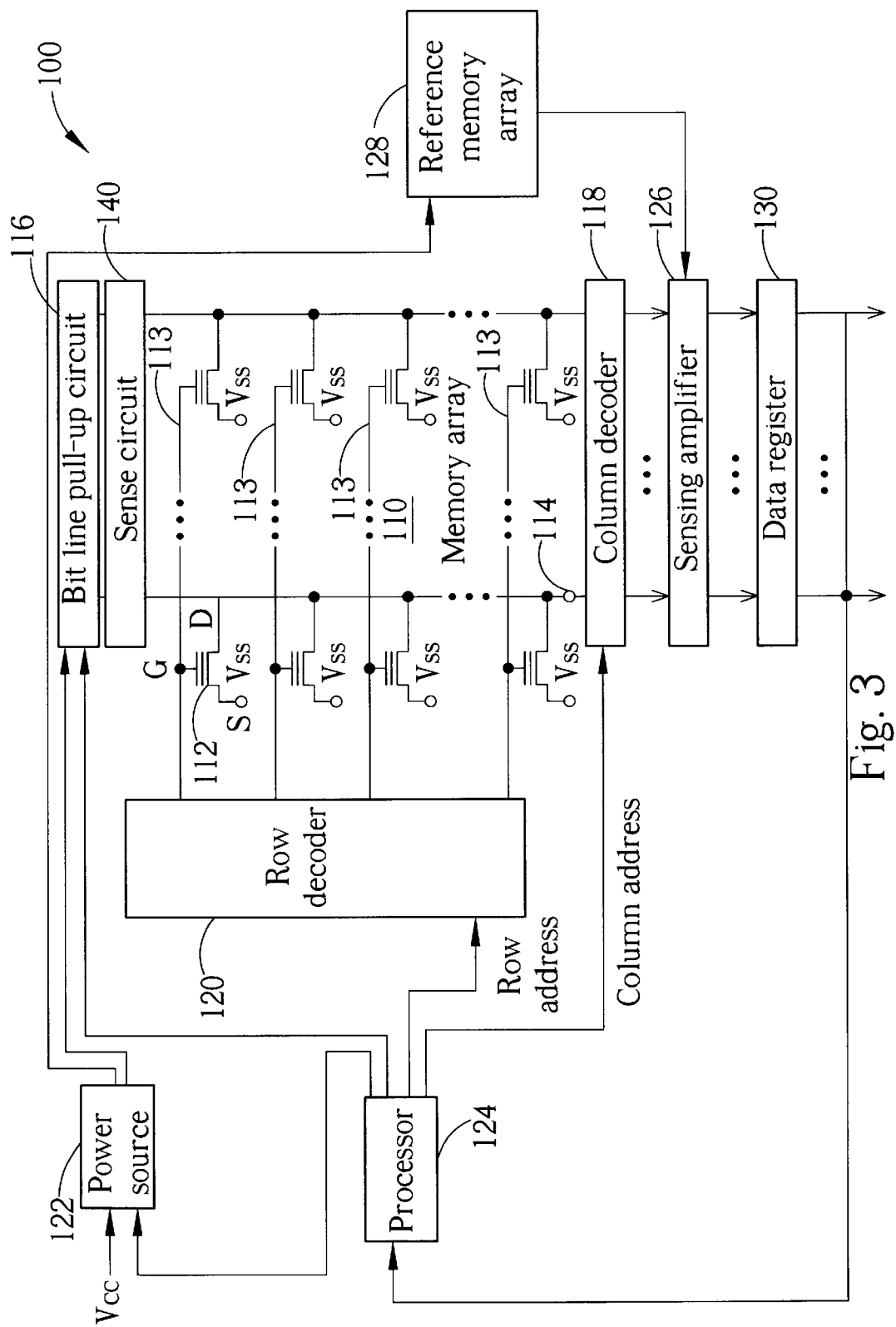
FIG. 3 is a diagram of the present invention flash memory circuit.

Please refer to FIG. 3. FIG. 3 is a diagram of a present invention flash memory circuit 100. The main difference between the flash memory circuit 100 of the present invention with the flash memory circuit 10 of the prior art is that the flash memory circuit 100 further comprises a sense circuit 140. The sense circuit 140 is electrically connected to a plurality of bitlines 114 of a flash memory array 110 for sensing a magnitude of each current flowing through a corresponding bitline 114. As with the flash memory circuit 10, the flash memory circuit 100 also has the flash memory array 110, a bitline pull-up circuit 116, a column decoder 118, a row decoder 120, a power source 122, a processor 124, a sense amplifier 126, a reference memory array 128, and a data register 130. The flash memory array 110 comprises a plurality of flash memory cells 112, and each flash memory cell 112 comprises a source S, a control gate G, and a drain D. The control gate G is electrically connected to a corresponding wordline 113, and the drain D is electrically connected to a corresponding bitline 114. Each bitline 114 is electrically connected to the bitline pull-up circuit 116. The processor 124 is used to control operations of the flash memory circuit 100 to perform reading, erasing, or writing to the plurality of flash memory cells 112 of the flash memory array 110. When the processor 124 performs a reading, erasing, or writing operation to a flash memory flash cell 112, the processor 124 respectively sends related control signals to the row decoder 120 and the column decoder 118 to control voltages of the wordline 113 and the bitline 114 connected to the flash memory cell 112. The reference memory array 128 outputs a reference signal, and the sense amplifier 126 compares the reference signal outputted from the reference memory array 128 with the signal outputted from the flash memory cell 112. The data register 130 is used to temporarily store data outputted from the flash memory array 110. The power source 122 supplies power needed by the flash-memory circuit 100.

Figure 4:
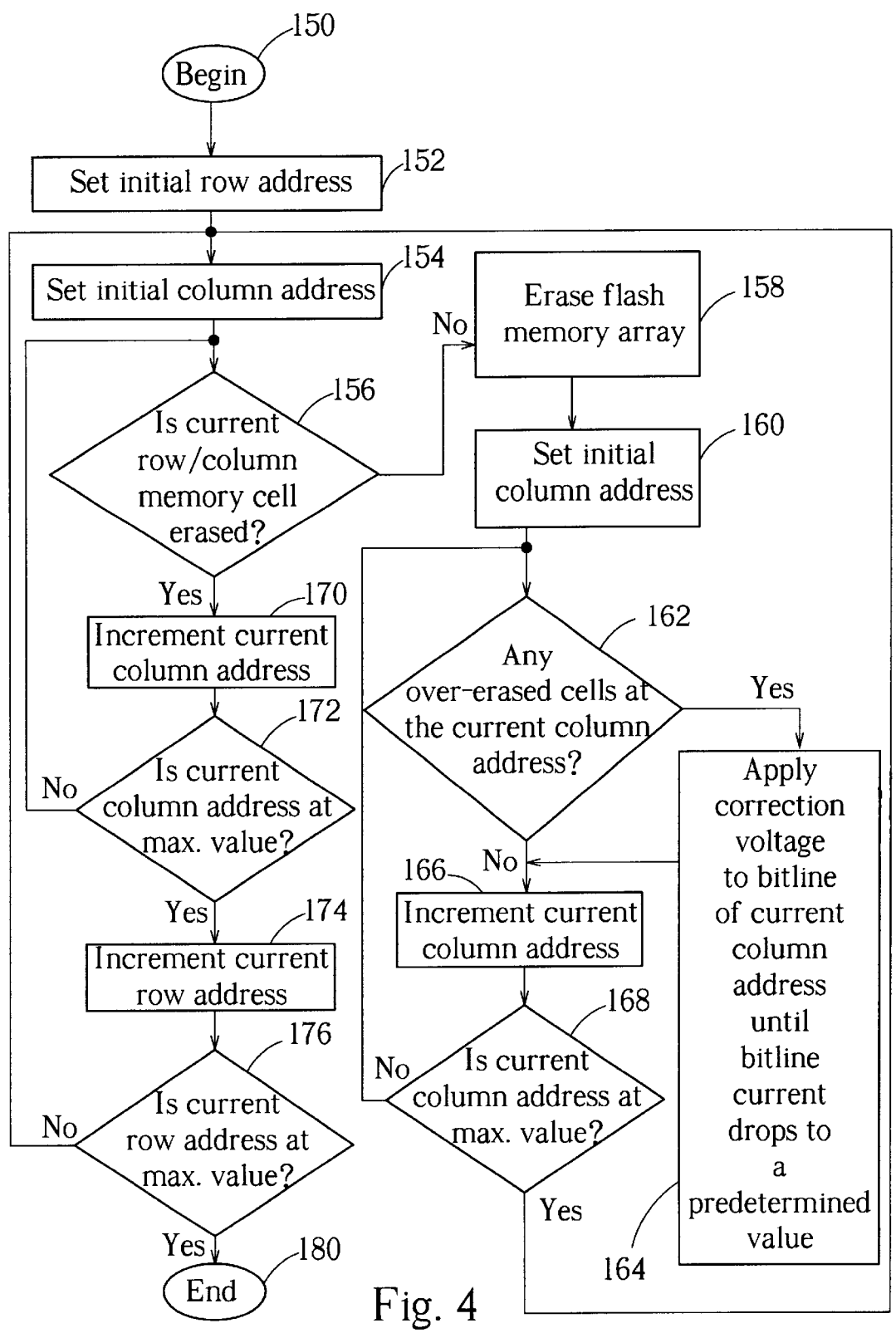
FIG. 4 is a flow chart of the flash memory circuit of FIG. 3 for erasing a flash memory array and correcting any over-erased flash memory cells.

Please refer to FIG. 4. FIG. 4 is a flow chart of the flash memory circuit 100 for erasing the flash memory array 110 and correcting any over-erased flash memory cells 112. The erasing procedure for the flash memory array 110 and appropriate correcting of any over-erased flash memory cells 112 has following steps:

Step 150: Start.

Step 152: Set the row address to the first row.

Step 154: Set the column address to the first column.

Step 156: Determine if the flash memory cell 112 at current column and row address is erased. If not erased, go to step 158. If erased, go to step 170.

Step 158: Apply an erasing voltage to the flash memory array 110 to erase all flash memory cells 112.

Step 160: Set the column address to the first column.

Step 162: Check if any of the flash memory cells 112 are over-erased. If so, go to step 164. If not, go to step 166.

Step 164: Apply a correction voltage to the bitline of the column address until the magnitude of current flowing through the bitline is reduced to a predetermined value.

Step 166: Increase the column address by 1.

Step 168: Determine if the column address is the largest possible column address. If so, go to step 154. If not, go to step 162.

Step 170: Increase the column address by 1.

Step 172: Determine if the column address is the largest possible column address. If so, go to step 174. If not, go to step 156.

Step 174: Increase the row address by 1.

Step 176: Determine if the row address is the largest possible row address. If so, go to step 180. If not, go to step 154.

Step 180: End.

The procedure for erasing the flash memory array 110 (all steps but for step 162 to step 168) is the same as the prior art procedure (but for steps 62 to 68). The difference between the two is the procedure of correcting over-erased flash memory cells 112 (i.e. step 164). The flash memory circuit 100 of the present invention applies a correction voltage to the bitline 114 that is electrically connected to the over-erased flash memory cell 112 to correct the over-erased flash memory cell 112. When the correction voltage is applied to the bitline 114 that is electrically connected to the over-erased flash memory cell 112, the sense circuit 140 senses the magnitude of current flowing through the bitline 114 coupled to the over-erased flash memory cell 112. During the correction procedure, the threshold voltage of the over-erased flash memory cell is continuously increasing, and so the magnitude of current sensed by the sense circuit 140 is continuously decreasing. When the magnitude of the current sensed by the sense circuit 140 drops to a predetermined value, the flash memory circuit 100 stops applying the correction voltage to the bitline 114.

Figure 5:
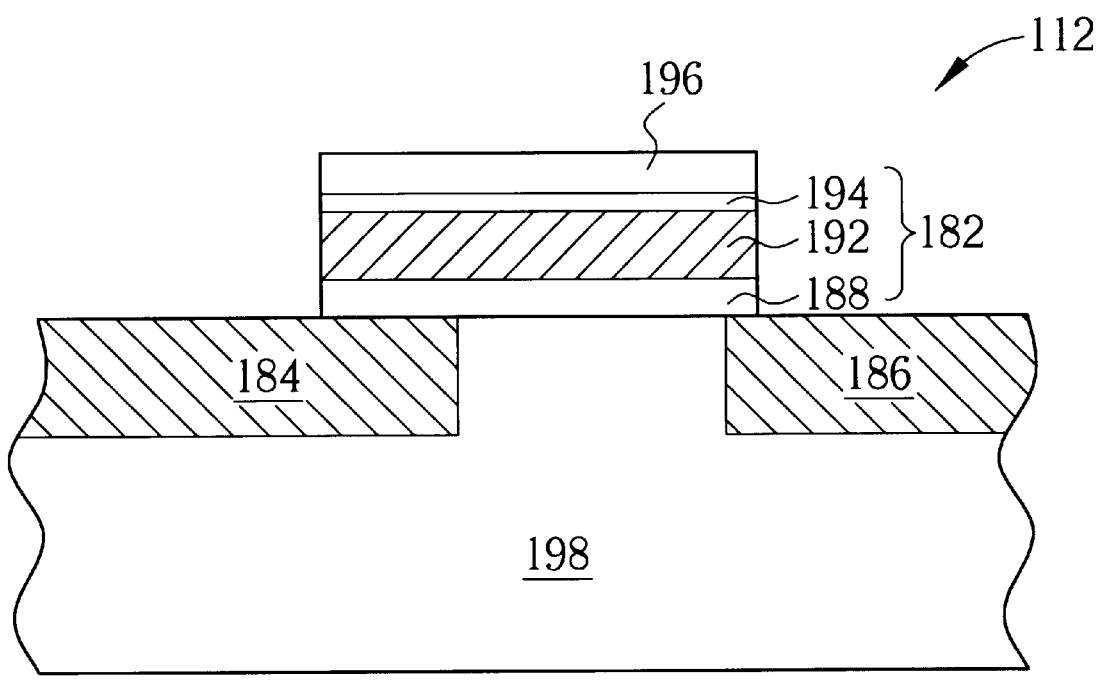
FIG. 5 is a schematic diagram of flash memory cells of FIG. 3.

Please refer to FIG. 5. FIG. 5 is a schematic diagram of a flash memory cell 112. As shown in FIG. 5, each flash memory cell 112 of the flash memory array 110 comprises a stacked gate 182, a drain 184, and a source 186. The stacked gate 182 is a stacked structure comprising a gate oxidation layer 188, a floating gate 192, an isolation layer 194, and a control gate 196, all of which are stacked on a silicon substrate 198 between the drain 184 and the source 186. The control gate 196 of the flash memory cell 112 is connected to a corresponding wordline 113 of the flash memory circuit 100, and the drain 184 is electrically connected to a corresponding bitline 114. When the flash memory circuit 100 corrects an over-erased flash memory cell 112, the source 186 and the control gate 196 of the over-erased flash memory cell 112 are connected to ground. When the flash memory circuit 100 applies the correction voltage to the bitline 114 electrically connected to the over-erased flash memory cell 112, because the value of the threshold voltage of the over-erased flash memory cell 112 is negative, the over-erased flash memory is channeled. At this time, hot electrons are generated and driven onto the floating gate 192. With increasing numbers of electrons driven onto the floating gate 192, the threshold voltage of the over-erased flash memory cell 112 becomes larger. As the threshold voltage of the over-erased flash memory cell 112 becomes larger, the magnitude of current flowing through the bitline 114 electrically connected to the over-erased flash memory cell 112 becomes smaller.

The present invention method comprises the following steps:

(A) Detect if the plurality of flash memory cells 112 of the flash memory array 110 have any over-erased flash memory cells.

(B) If any over-erased flash memory cells 112 are detected, apply a correction voltage to the bitline electrically connected to the over-erased flash memory cell 112 to correct the over-erased flash memory cell 112. And:

(C) When the correction voltage is applied to the bitline 114, if the sense circuit 140 determines that the magnitude of current flowing through the bitline 114 coupled to the over-erased flash memory cell 112 is reduced to a predetermined value, stop applying the correction voltage to the bitline 114.

The present invention flash memory circuit 100 continuously applies a correction voltage to a bitline electrically connected to an over-erased flash memory cell 112 when correcting the over-erased flash memory cell 112, and senses the magnitude of current flowing through the corresponding bitline 114. When the magnitude of current sensed by the sense circuit 140 drops to a predetermined value, the processor 124 is notified to control the flash memory circuit 100 to stop applying the correction voltage to the bitline 114. Consequently, with the present invention method, there is no need to recheck if the over-erased flash memory cell 112 has been corrected with each application of a correction voltage pulse. The erasing/correction procedure is thus faster.

In contrast to the prior art method, the present invention provides a method to apply a continuous correction voltage to a bitline electrically connected to an over-erased flash memory cell to correct the over-erased flash memory cell. While applying the correction voltage, the sense circuit checks the magnitude of current flowing through the corresponding bitline. When the magnitude of current detected by the sense circuit is reduced to a predetermined value, the flash memory circuit stops applying the correction voltage to the bitline. Therefore, with the present invention method, when the flash memory circuit corrects an over-erased flash memory cell, the long and repeated correction and checking steps are avoided so that the correction procedure is quicker.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method for correcting an over-erased flash memory cell in a flash memory circuit, the flash memory circuit comprising:

a flash memory array having a plurality of erasable flash memory cells, each memory cell coupled to a corresponding bitline; and a sense circuit sensing a magnitude of current flowing through each of the bitlines coupled to the flash memory cells;

the method comprising:

detecting said over-erased memory cell in the flash memory array;

applying a correction voltage to the bitline coupled to the over-erased flash memory cell to correct the over-erased flash memory cell; and terminating application of the correction voltage to the bitline coupled to the over-erased flash memory cell when the magnitude of the current flowing through the bitline coupled to the over-erased flash memory cell, as detected by the sense circuit, is reduced to a predetermined value.

2. The method of claim 1 wherein each of the flash memory cells comprises a floating gate, and when the correction voltage is applied to the bitline coupled to the over-erased flash memory cell, electrons are driven into the floating gate of the flash memory cell so that a threshold voltage of the over-erased flash memory cell increases and leads to a reduction in the magnitude of the current flowing through the bitline coupled to the flash memory cell.

3. The method of claim 1 further comprising terminating application of the correction voltage if the magnitude of the current flowing through the bitline coupled to the over-erased flash memory cell does not reduce to the predetermined value when a correction time period of the over-erased flash memory cell exceeds a predefined value.

4. The method of claim 1 wherein the flash memory array comprises a plurality of wordlines, and each of the flash memory cells comprises a source, a control gate coupled to one of the wordlines, and a drain coupled to the corresponding bitline.

5. The method of claim 1 wherein a threshold voltage of the over-erased flash memory cell is below zero volts, each of the flash memory cells comprising a floating gate, and when the correction voltage is applied to the bitline coupled to the over-erased flash memory cell, the over-erased flash memory cell is turned on so that hot electrons are generated and driven into the floating gate of the over-erased flash memory cell, which causes the threshold voltage of the over-erased flash memory cell to increase and leads to a reduction in the magnitude of the current flowing through the bitline coupled to the over-erased flash memory cell.

6. A flash memory circuit comprising:

a flash memory array having a plurality of erasable flash memory cells, each flash memory cell coupled to a corresponding bitline;

a sense circuit sensing the magnitude of current flowing through each of the bitlines; and a processor for controlling operations of the flash memory circuit and detecting if any flash memory cell in the flash memory array is over-erased, the processor controlling the flash memory circuit to apply a correction voltage to the bitline coupled to an over-erased flash memory cell to correct the over-erased flash memory cell;

wherein when the correction voltage is applied to the bitline coupled to the over-erased flash memory cell, if the magnitude of the current flowing through the bitline coupled to the over-erased flash memory cell as detected by the sense circuit is below a predetermined value, the flash memory circuit stops applying the correction voltage to the bitline coupled to the over-erased flash memory cell.

7. The flash memory circuit of claim 6 wherein each of the flash memory cells comprises a floating gate, and when the correction voltage is applied to the bitline coupled to the over-erased flash memory cell, electrons are driven into the floating gate of the over-erased flash memory cell so that a threshold voltage of the over-erased flash memory cell increases and leads to the magnitude of the current flowing through the bitline coupled to the over-erased flash memory cell being reduced.

8. The flash memory circuit of claim 6 wherein when a correction time period of the over-erased flash memory cell exceeds a predefined value, and if the magnitude of the current flowing through the bitline coupled to the over-erased flash memory cell is not below the predetermined value, the flash memory circuit stops applying the correction voltage.

9. The flash memory circuit of claim 6 wherein the flash memory array comprises a plurality of wordlines, and each of the flash memory cells comprises a source, a control gate coupled to one of the wordlines, and a drain coupled to the corresponding bitline.

10. The flash memory circuit of claim 6 wherein a threshold voltage of the over-erased flash memory cell is below zero volts, each of the flash memory cells comprises a floating gate, and when the correction voltage is applied to the bitline coupled to the over-erased flash memory cell, the over-erased flash memory cell is turned on so that hot electrons are generated and driven into the floating gate of the over-erased flash memory cell, causing the threshold voltage of the over-erased flash memory cell to increase and leads to a reduction of the magnitude of the current flowing through the bitline coupled to the over-erased flash memory cell.

* * * * *